United States Patent
Lai et al.

(10) Patent No.: US 11,094,792 B2
(45) Date of Patent: Aug. 17, 2021

(54) MANUFACTURING METHOD OF SPLIT GATE STRUCTURE AND SPLIT GATE STRUCTURE

(71) Applicant: Mosel Vitelic Inc., Hsinchu (TW)

(72) Inventors: Shih-Chi Lai, Hsinchu (TW);
Hung-Chih Chung, Hsinchu (TW);
Hsien-Yi Cheng, Hsinchu (TW);
Chia-Ming Kuo, Hsinchu (TW)

(73) Assignee: MOSEL VITELIC INC., Hsinchu (TW)

( * ) Notice: Subject to any disclaimer, the term of this patent is extended or adjusted under 35 U.S.C. 154(b) by 0 days.

(21) Appl. No.: 16/547,867

(22) Filed: Aug. 22, 2019

(65) Prior Publication Data

US 2020/0328281 A1 Oct. 15, 2020

(30) Foreign Application Priority Data

Apr. 11, 2019 (TW) .................................. 108112767

(51) Int. Cl.
*H01L 21/28* (2006.01)
*H01L 21/8234* (2006.01)
(Continued)

(52) U.S. Cl.
CPC .... *H01L 29/4236* (2013.01); *H01L 21/28123* (2013.01); *H01L 21/28185* (2013.01); *H01L 29/66734* (2013.01); *H01L 29/7813* (2013.01)

(58) Field of Classification Search
CPC ........... H01L 29/4236; H01L 21/28123; H01L 21/28185; H01L 29/66734; H01L 29/7813
(Continued)

(56) References Cited

U.S. PATENT DOCUMENTS 4,672,410 A * 6/1987 Miura ................. H01L 29/7827
257/302
6,033,943 A * 3/2000 Gardner .......... H01L 21/823857
257/E21.639
(Continued)

FOREIGN PATENT DOCUMENTS

CN 101107718 A * 1/2008 ......... H01L 29/7806
JP H0964213 A 3/1997
(Continued)

*Primary Examiner* — Ismail A Muse
*Assistant Examiner* — David W Houston, III
(74) *Attorney, Agent, or Firm* — Kirton McConkie; Evan R. Witt

(57) ABSTRACT

A manufacturing method of a split gate structure includes steps of forming a mask oxide layer on the substrate, performing photolithography and etching on the mask oxide layer and the substrate, forming a trench, removing the mask oxide layer, forming a bottom oxide layer on a bottom part and a side wall of the trench and a surface of the substrate, forming a silicon nitride layer on the trench, removing a part of the bottom oxide layer, forming a gate oxide layer on part of the side wall and the surface, forming a gate poly layer on the trench, removing the silicon nitride layer, forming an inter-poly oxide layer on the gate poly layer, and forming a shield poly layer on the trench, thereby benefiting the increasing of the thickness of the inter-poly oxide layer, so that the advantages of improving the characteristics of the split gate structure are achieved.

8 Claims, 5 Drawing Sheets

(51) Int. Cl.
  *H01L 29/423*   (2006.01)
  *H01L 29/66*    (2006.01)
  *H01L 29/78*    (2006.01)
(58) Field of Classification Search
  USPC .......................................................... 257/330
  See application file for complete search history.

(56) References Cited

U.S. PATENT DOCUMENTS

| | | | |
|---|---|---|---|
| 2004/0166636 A1* | 8/2004 | Darwish | H01L 29/1095 |
| | | | 438/270 |
| 2008/0085584 A1* | 4/2008 | Noh | H01L 21/28247 |
| | | | 438/264 |
| 2017/0301751 A1* | 10/2017 | Agata | H01L 29/66128 |
| 2018/0151580 A1* | 5/2018 | Wu | H01L 29/66825 |
| 2018/0269293 A1* | 9/2018 | Yilmaz | H01L 29/7827 |
| 2020/0328302 A1* | 10/2020 | Lin | H01L 29/66128 |

FOREIGN PATENT DOCUMENTS

| | | | |
|---|---|---|---|
| KR | 1020050069114 A | 7/2005 | |
| TW | 432504 B | 5/2001 | |

\* cited by examiner

MANUFACTURING METHOD OF SPLIT GATE STRUCTURE AND SPLIT GATE STRUCTURE

FIELD OF THE INVENTION

The present disclosure relates to a manufacturing method of a split gate structure, and more particularly to a manufacturing method of a split gate structure and a split gate structure.

BACKGROUND OF THE INVENTION

With the development of science and technology, the Metal Oxide Semiconductor Field Effect Transistor (MOSFET) has become a common semiconductor component in integrated circuits, among which the trench MOSFET has better characteristics, and the traditional MOSFET is gradually replaced with the trench MOSFET.

An embodiment of the trench MOSFET is the split gate MOSFET, which has a structure that the gate structure of the trench MOSFET is separated by the inter-poly oxide (IPO), so that the gate-drain capacitance can be reduced, and the breakdown voltage of the transistor can be improved. In addition, the gate leakage current and the capacitance value may be affected by the thickness of the inter-poly oxide, and this thickness is preferred to be large, generally.

In prior art, by the chemical vapor deposition method, the inter-poly oxide with a thicker thickness can be prepared in the split gate structure. However, in such method, in a region where the inter-poly oxide is not required to be formed, it is difficult to remove the formed inter-poly oxide. In another method, the inter-poly oxide can be produced at the same time as the gate oxide is prepared. Nevertheless, in this case, the process parameters of these two oxide layers may affect with each other, such that the generated inter-poly oxide is thin, thus resulting in poor component performance.

For overcoming the drawbacks of the conventional technologies, there is a need of providing an improved manufacturing method of a split gate structure and a split gate structure.

SUMMARY OF THE INVENTION

An object of the present disclosure provides a manufacturing method of a split gate structure and a split gate structure to address the issues encountered by the prior arts.

In accordance with an aspect of the present disclosure, there is provided a manufacturing method of a split gate structure and a split gate structure. By respectively forming the gate oxide layer and the inter-poly oxide layer in different steps, the process parameters thereof can be individually adjusted, thereby benefiting the increasing of the thickness of the inter-poly oxide layer, so that the inter-poly oxide layer with a thicker thickness can be formed, and thus the advantages of improving the characteristics of the split gate structure are achieved.

In accordance with another aspect of the present disclosure, there is provided a manufacturing method of a split gate structure and a split gate structure. By forming the inter-poly oxide layer on the gate poly layer through a thermal oxidation method, it would be beneficial to adjust the process parameters to change the thickness of the inter-poly oxide layer in the split gate structure, and thus the influence on the gate leakage current and the capacitance value can be changed.

In an embodiment, the manufacturing method of a split gate structure includes steps of: (a) forming a mask oxide layer on the substrate, and performing photolithography and etching on the mask oxide layer and the substrate, wherein a trench is formed; (b) removing the mask oxide layer; (c) forming a bottom oxide layer on a bottom part of the trench, a side wall of the trench and a surface of the substrate; (d) forming a silicon nitride layer on the trench; (e) removing a part of the bottom oxide layer, and forming a gate oxide layer on the surface and a part of the side wall; (f) forming a gate poly layer on the trench; (g) removing the silicon nitride layer, and forming an inter-poly oxide layer on the gate poly layer; and (h) forming a shield poly layer on the trench.

In an embodiment, the split gate structure includes a substrate, a bottom oxide layer, a gate oxide layer, a shield poly layer, a gate poly layer and an inter-poly oxide layer. The substrate has a surface, and a trench is formed on the substrate. The trench has a bottom part and a side wall. The bottom oxide layer is disposed on the bottom part and a part of the side wall. The gate oxide layer is disposed on the other part of the side wall and the surface. The shield poly layer is disposed in the trench and disposed on the bottom oxide layer. The gate poly layer is disposed symmetrically to the shield poly layer on the bottom oxide layer, and the gate poly layer is connected with the gate oxide layer. The inter-poly oxide layer is disposed symmetrically to the shield poly layer on the gate poly layer, and the bottom oxide layer is connected with the gate oxide layer. A part of the inter-poly oxide layer is disposed between the shield poly layer and the gate poly layer.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1B:
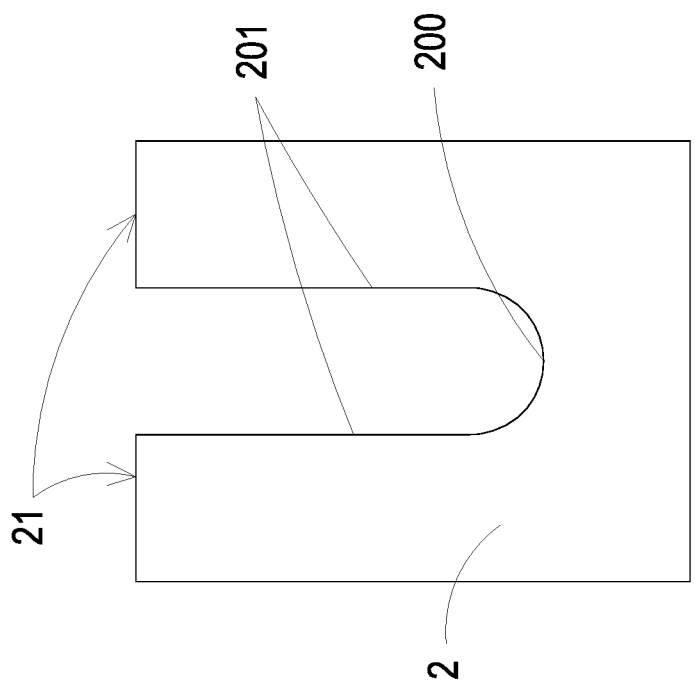
FIG. 1A to FIG. 1H schematically illustrate the flow structures of a manufacturing method of a split gate structure according to an embodiment of the present disclosure.
Figure 1A:
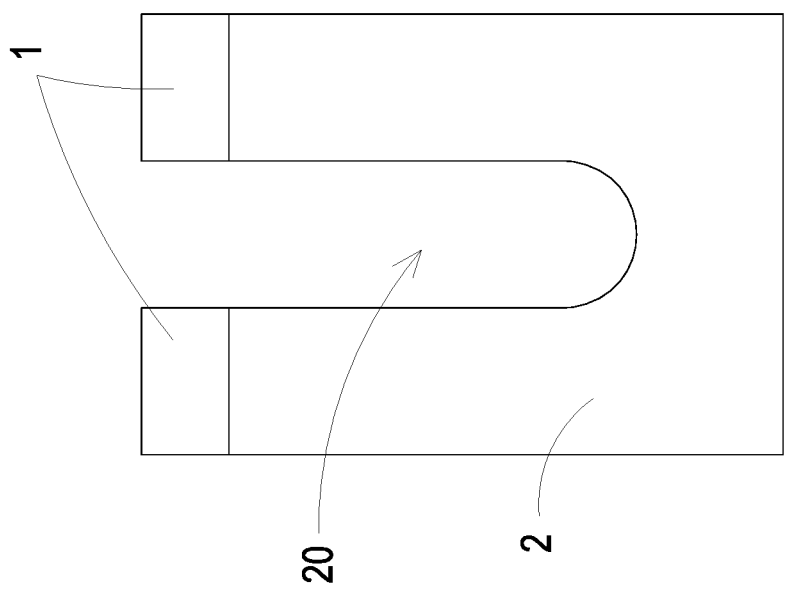
Figure 1D:
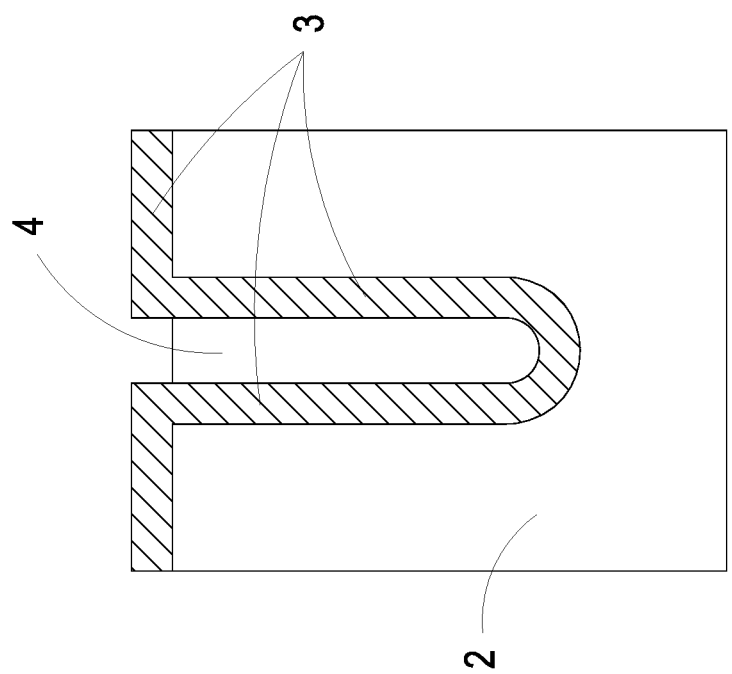
Figure 1C:
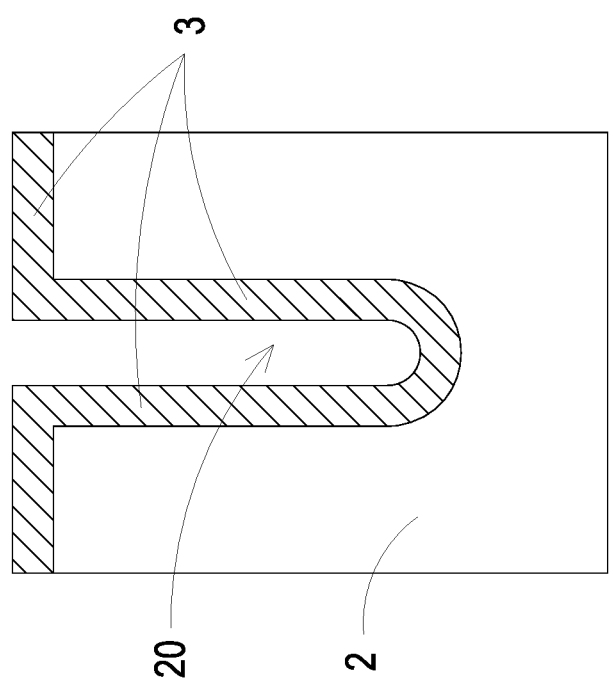
Figure 1F:
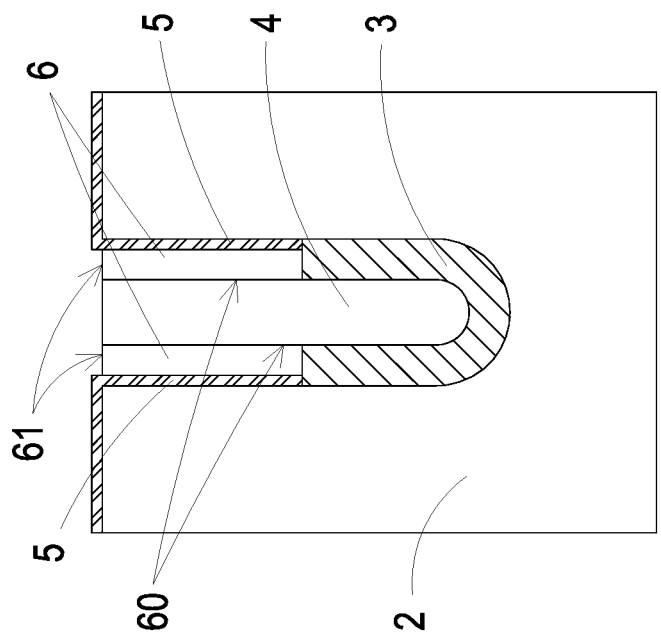
Figure 1E:
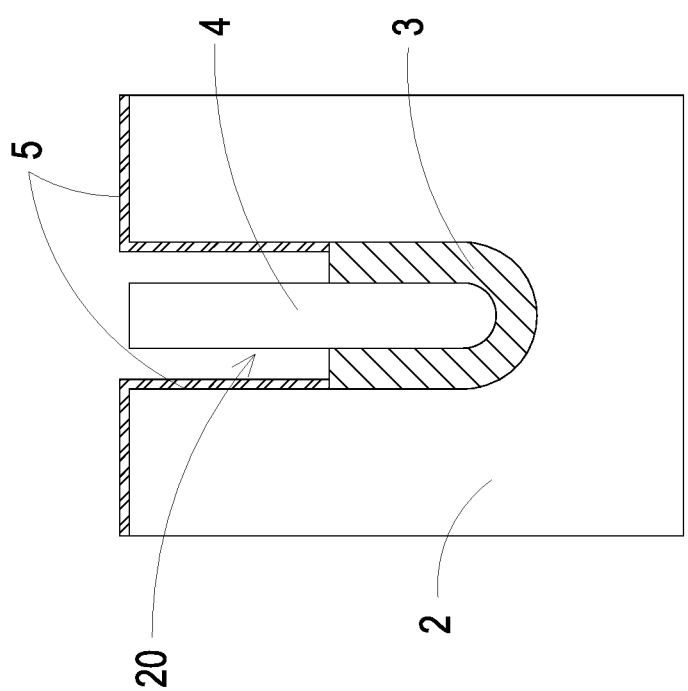
Figure 1G:
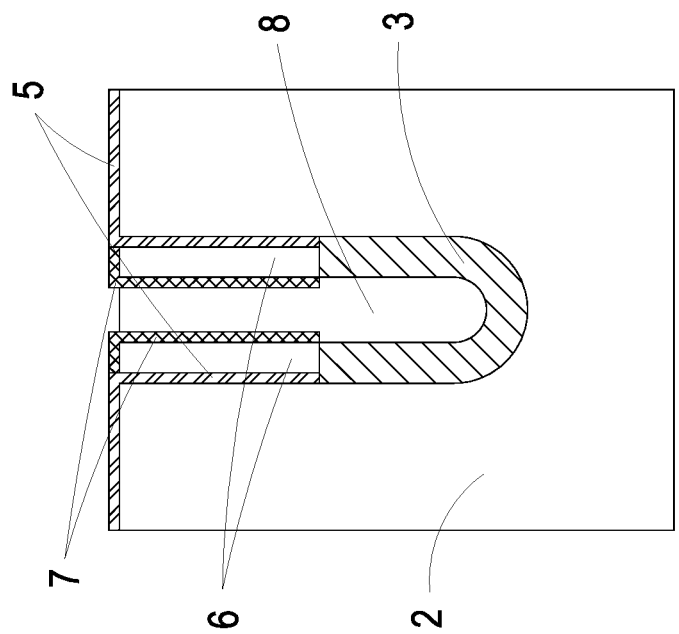
Figure 1H:
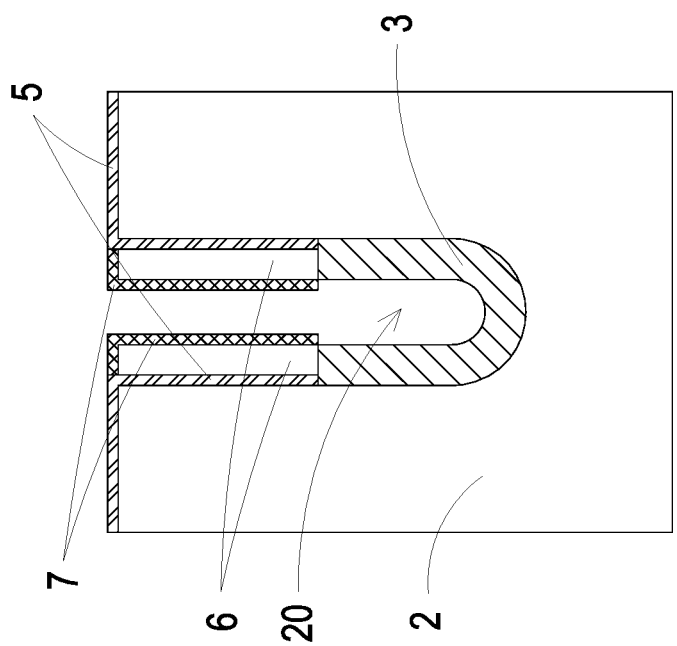

Please refer to FIG. 1A to FIG. 1H. FIG. 1A to FIG. 1H schematically illustrates the flow structures of a manufacturing method of a split gate structure according to an embodiment of the present disclosure. As shown in FIG. 1A to FIG. 1H, the manufacturing method of the split gate structure includes the following steps. Firstly, a mask oxide layer 1 is formed on the substrate 2, then photolithography and etching are performed on the mask oxide layer 1 and the substrate 2, and a trench 20 is formed, so as to form the structure as shown in FIG. 1A. Next, the mask oxide layer 1 is removed, so as to form the structure as shown in FIG. 1B. Then, a bottom oxide layer 3 is formed on a bottom part 200 of the trench 20, a side wall 201 of the trench 20 and a surface 21 of the substrate 2, so as to form the structure as shown in FIG. 1C. Then, a silicon nitride layer 4 is formed on the trench 20, so as to form the structure as shown in FIG. 1D. Then, a part of the bottom oxide layer 3 is removed, and a gate oxide layer 5 is formed on the surface 21 and a part of the side wall 201, so as to form the structure as shown in FIG. 1E. Then, a gate poly layer 6, also known as a gate polysilicon layer, is formed on the trench 20, so as to form the structure as shown in FIG. 1F. Then, the silicon nitride layer 4 is removed, and an inter-poly oxide layer 7 is formed on the gate poly layer 6, so as to form the structure as shown in FIG. 1G. Lastly, a shield poly layer 8, also known as a shield polysilicon layer, is formed on the trench 20, and finally the split gate structure as shown in FIG. 1H is formed.

In other words, in the manufacturing method of the split gate structure of the present disclosure, by respectively forming the gate oxide layer and the inter-poly oxide layer in different steps, the process parameters thereof can be individually adjusted, thereby benefiting the increasing of the thickness of the inter-poly oxide layer, so that the inter-poly oxide layer with a thicker thickness can be formed, and thus the advantages of improving the characteristics of the split gate structure are achieved.

In some embodiments, the step of forming the mask oxide layer 1 on the substrate 2, performing photolithography and etching on the mask oxide layer 1 and the substrate 2, and forming the trench 20 further includes the following steps. Firstly, the mask oxide layer 1 is formed on the substrate 2 by a chemical vapor deposition method. Next, the trench patterning is performed on the substrate 2 and the mask oxide layer 1. Then, a photolithography process of the trench patterning portion is performed to form the trench 20. Then, the etching (e.g., wet etching or chemical etching) is performed on the mask oxide layer 1. Lastly, the etching (e.g., dry etching) is performed on the trench 20, so as to form the structure as shown in FIG. 1A.

In some embodiments, in the step of forming the bottom oxide layer 3 on the bottom part 200 of the trench 20, the side wall 201 of the trench 20 and the surface 21 of the substrate 2, the bottom oxide layer 3 is formed on the bottom part 200, the side wall 201 and the surface 21 by a thermal oxidation method, thereby forming the structure as shown in FIG. 1C.

In some embodiments, the step of forming the silicon nitride layer 4 on the trench 20 further includes the following step. The silicon nitride layer 4 is formed on the trench 20 and filled up the trench 20 by a chemical vapor deposition method, and then the etching back is performed on the silicon nitride layer 4 to remove a part of the silicon nitride layer 4, so as to form the structure as shown in FIG. 1D.

In some embodiments, in the step of removing the part of the bottom oxide layer 3 and forming the gate oxide layer 5 on the surface 21 of the substrate 2 and the part of the side wall 201, the bottom oxide layer 3 located on an upper end of the side wall 201 is removed, the bottom oxide layer 3 located on the surface 21 is removed, and the gate oxide layer 5 is formed on the upper end of the side wall 201 and the surface 21. Furthermore, the gate oxide layer 5 can be formed on the upper end of the side wall 201 and the surface 21 by a thermal oxidation method, thereby forming the structure as shown in FIG. 1E, but not limited herein.

In some embodiments, the step of forming the gate poly layer 6 on the trench 20 further includes the following step. The gate poly layer 6 is formed on the trench 20 and filled up the trench 20 by a chemical vapor deposition method, and then the etching back is performed on the gate poly layer 6 to remove a part of the gate poly layer 6, so as to form the structure as shown in FIG. 1F.

In some embodiments, in the step of removing the silicon nitride layer 4 and forming the inter-poly oxide layer 7 on the gate poly layer 6, the inter-poly oxide layer 7 is formed on a side surface 60 and a top surface 61, which are exposed, of the gate poly layer 6, by a thermal oxidation method, so as to form the structure as shown in FIG. 1G.

In some embodiments, the step of forming the shield poly layer 8 on the trench 20 further includes the following step. The shield poly layer 8 is formed on the trench 20 and filled up the trench 20 by a chemical vapor deposition method, and then the etching back is performed on the shield poly layer 8 to remove a part of the shield poly layer 8. Therefore, the split gate structure finally formed is the structure shown in FIG. 1H.

That is to say, in the manufacturing method of the split gate structure of the present disclosure, by forming the inter-poly oxide layer on the gate poly layer through a thermal oxidation method, it would be beneficial to adjust the process parameters to change the thickness of the inter-poly oxide layer in the split gate structure, and thus the influence on the gate leakage current and the capacitance value can be changed.

Figure 2:
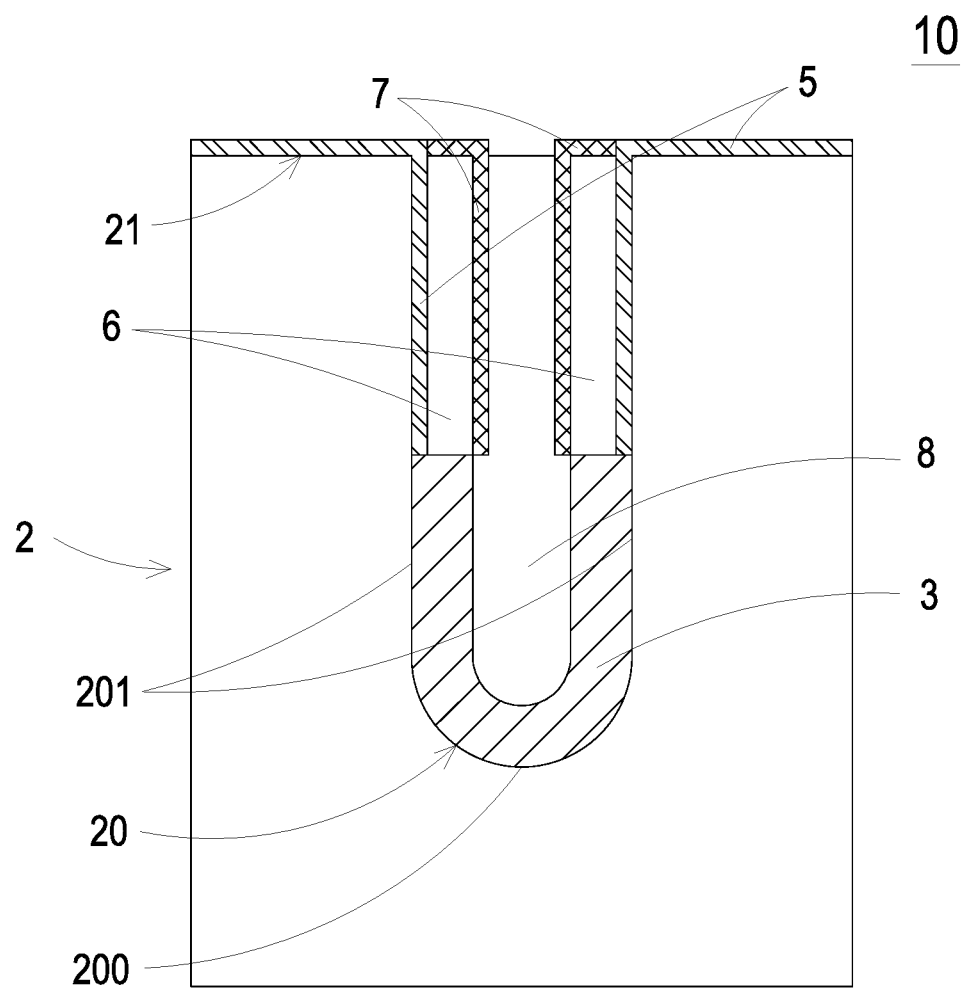
FIG. 2 schematically illustrates the structure of a split gate structure according to an embodiment of the present disclosure.

Please refer to FIG. 2. FIG. 2 schematically illustrates the structure of a split gate structure according to an embodiment of the present disclosure. As shown in FIG. 2, the split gate structure 10 can be formed by the manufacturing method of the split gate structure described above, and the split gate structure 10 includes a substrate 2, a bottom oxide layer 3, a gate oxide layer 5, a shield poly layer 8, a gate poly layer 6 and an inter-poly oxide layer 7. Furthermore, the split gate structure 10 can be applied to semiconductor components such as a split gate MOSFET, but not limited herein.

The substrate 2 has a surface 21, and a trench 20 is formed on the substrate 2. The trench 20 has a bottom part 200 and a side wall 201. The bottom oxide layer 3 is disposed on the bottom part 200 and a part of the side wall 201 of the trench 20, and the gate oxide layer 5 is disposed on the other part of the side wall 201 and the surface 21 of the substrate 2. That is to say, in the trench 20, the bottom oxide layer 3 is disposed on the bottom part 200 and a lower end of the side wall 201, and the gate oxide layer 5 is disposed on an upper end of the side wall 201, thereby covering the trench surface of the trench 20. The shield poly layer 8 is disposed in the trench 20, and the shield poly layer 8 is disposed on the bottom oxide layer 3. The gate poly layer 6 is disposed symmetrically to the shield poly layer 8 on the bottom oxide layer 3, and the gate poly layer 6 is connected with the gate oxide layer 5.

The inter-poly oxide layer 7 is disposed symmetrically to the shield poly layer 8 on the gate poly layer 6, and the bottom oxide layer 3 is connected with the gate oxide layer 5. Furthermore, a part of the inter-poly oxide layer 7 is disposed between the shield poly layer 8 and the gate poly layer 6 and connected with the bottom oxide layer 3, such that the shield poly layer 8 is separated apart from the gate poly layer 6. In addition, the other part of the inter-poly oxide layer 7 is disposed on the top surface of the gate poly layer 6 and connected with the gate oxide layer 5, but not limited herein.

In some embodiments, the thickness of the inter-poly oxide layer 7 is larger than the thickness of the gate oxide layer 5, and the thickness of the bottom oxide layer 3 is larger than the thickness of the gate oxide layer 5, thereby achieving the advantage of enhancing the overall performance of the semiconductor component, but not limited herein.

From the above descriptions, the present disclosure provides a manufacturing method of a split gate structure and a split gate structure. By respectively forming the gate oxide layer and the inter-poly oxide layer in different steps, the process parameters thereof can be individually adjusted, thereby benefiting the increasing of the thickness of the inter-poly oxide layer, so that the inter-poly oxide layer with a thicker thickness can be formed, and thus the advantages of improving the characteristics of the split gate structure are achieved. Meanwhile, by forming the inter-poly oxide layer on the gate poly layer through a thermal oxidation method, it would be beneficial to adjust the process parameters to change the thickness of the inter-poly oxide layer in the split gate structure, and thus the influence on the gate leakage current and the capacitance value can be changed.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a split gate structure, comprising steps of:
   (a) forming a mask oxide layer on the substrate, and performing photolithography and etching on the mask oxide layer and the substrate, wherein a trench is formed;
   (b) removing the mask oxide layer;
   (c) forming a bottom oxide layer on a bottom part of the trench, a side wall of the trench and a surface of the substrate;
   (d) forming a silicon nitride layer on the trench;
   (e) removing a part of the bottom oxide layer, and forming a gate oxide layer on the surface and a part of the side wall;
   (f) forming a gate poly layer on the trench;
   (g) removing the silicon nitride layer, and forming an inter-poly oxide layer on the gate poly layer; and
   (h) forming a shield poly layer on the trench.

2. The manufacturing method of the split gate structure according to claim 1, wherein the step (d) comprises a step of: forming the silicon nitride layer on the trench and filling up the trench, by a chemical vapor deposition method, and then performing etching back on the silicon nitride layer to remove a part of the silicon nitride layer.

3. The manufacturing method of the split gate structure according to claim 1, wherein in the step (e), the bottom oxide layer located on an upper end of the side wall and the bottom oxide layer located on the surface are removed, and the gate oxide layer is formed on the upper end of the side wall and the surface.

4. The manufacturing method of the split gate structure according to claim 3, wherein in the step (e), the gate oxide layer is formed on the upper end of the side wall and the surface by a thermal oxidation method.

5. The manufacturing method of the split gate structure according to claim 1, wherein the step (f) comprises a step of: forming the gate poly layer on the trench and filling up the trench, by a chemical vapor deposition method, and then performing etching back on the gate poly layer to remove a part of the gate poly layer.

6. The manufacturing method of the split gate structure according to claim 1, wherein in the step (g), the inter-poly oxide layer is formed on a side surface and a top surface, which are exposed, of the gate poly layer, by a thermal oxidation method.

7. The manufacturing method of the split gate structure according to claim 1, wherein the step (h) comprises a step of: forming the shield poly layer on the trench and filling up the trench, by a chemical vapor deposition method, and then performing etching back on the shield poly layer to remove a part of the shield poly layer.

8. The manufacturing method of the split gate structure according to claim 1, wherein in the step (a), the mask oxide layer is formed on the substrate by a chemical vapor deposition method, and wherein in the step (c), the bottom oxide layer is formed on the bottom part, the side wall and the surface by a thermal oxidation method.

* * * * *